United States Patent [19]
Murata

[11] Patent Number: 5,208,658
[45] Date of Patent: May 4, 1993

[54] SEMICONDUCTOR INTEGRATED CIRCUIT PROVIDED WITH CONTACT FOR INTER-LAYER CONNECTION AND METHOD OF INTER-LAYER CONNECTION THEREFOR

[75] Inventor: Masaomi Murata, Chiba, Japan

[73] Assignee: Kawasaki Steel Corporation, Hyogo, Japan

[21] Appl. No.: 809,148

[22] Filed: Dec. 18, 1991

[30] Foreign Application Priority Data

Dec. 28, 1990 [JP] Japan ............... 2-406234[U]

[51] Int. Cl.⁵ .................. H01L 23/48; H01L 21/82
[52] U.S. Cl. .................... 257/758; 257/775; 437/195
[58] Field of Search .................. 357/65, 68, 71

[56] References Cited

U.S. PATENT DOCUMENTS

| | | | |
|---|---|---|---|
| 3,715,635 | 2/1973 | Michel et al. | 357/74 |
| 4,500,906 | 2/1985 | Ohno et al. | 357/68 |
| 4,677,452 | 6/1987 | Zommer | 357/65 |
| 4,916,521 | 4/1990 | Yoshikawa et al. | 357/68 |
| 4,951,098 | 8/1990 | Albergo et al. | 357/68 |

FOREIGN PATENT DOCUMENTS

| | | |
|---|---|---|
| 57-50448 | 3/1982 | Japan . |
| 59-4138 | 1/1984 | Japan . |
| 60-224247 | 11/1985 | Japan . |
| 2-178975 | 7/1990 | Japan . |

OTHER PUBLICATIONS

Gaensslen et al., "High-density contact design", IBM TDB, vol. 14, No. 2, Jul./1971, p. 570.

Primary Examiner—Eugene R. LaRoche
Assistant Examiner—Viet Q. Nguyen
Attorney, Agent, or Firm—Oliff & Berridge

[57] ABSTRACT

By using a contact including a configuration in which a first pattern 10 having a widthwise dimension W1 in an outer shape substantially equal to a lengthwise dimension L1 in an outer shape and a second pattern 20 having a widthwise dimension W2 in an outer shape smaller than the widthwise dimension W1 in an outer shape of the first pattern are connected to each other, over etching is reduced and unevenness of saggings of a photoresist at the time of exposure or baking is lowered. Further, the area of a contact region where a contact can be disposed is effectively used, so that the area of the contact can be increased and electric resistance can be decreased.

10 Claims, 11 Drawing Sheets

SEMICONDUCTOR INTEGRATED CIRCUIT PROVIDED WITH CONTACT FOR INTER-LAYER CONNECTION AND METHOD OF INTER-LAYER CONNECTION THEREFOR

BACKGROUND OF THE INVENTION

1. Field of the Invention

This invention relates to a semiconductor integrated circuit and method of inter-layer connection therefor, using a contact having a relatively longer lengthwise dimension than a widthwise dimension for electrically connecting different layers to each other, which are a plurality of layers of laminated structure such as wiring layers made of polycrystalline silicon and metal, and more particularly to a semiconductor integrated circuit and method of inter-layer connection therefor, in which electric resistance by the contact is decreased.

2. Description of the Prior Art

In recent years, the degree of integration of the semiconductor integrated circuit has been further improved, and, along with this tendency, the dimensions of a contact for electrically connecting different layers to each other within the semiconductor integrated circuit have been further decreased.

However, with the above-described contact having small dimensions, such a problem is presented that it is difficult to work on it with high accuracy.

For example, with an elongate contact, the turn-in amount of light at the time of exposure is increased, and saggings of a photoresist at the time of developing or baking are different depending on the longer side or the shorter side of the contact, thus presenting such a problem that the widths of the contacts become uneven. For example, when a positive photoresist is used, the contact width at the central portion of the elongate contact is widened. When the width at the central portion of the contact is widened as described above, such a problem is presented that a portion, which should not be etched, is etched during etching.

In Japanese Patent Publication No. 33746/1987, contacts in an elongate contact region are formed of a plurality of square contacts spaced apart from one another, so that the working accuracy of the contact in the elongate contact region of this type can be improved.

Figure 11:
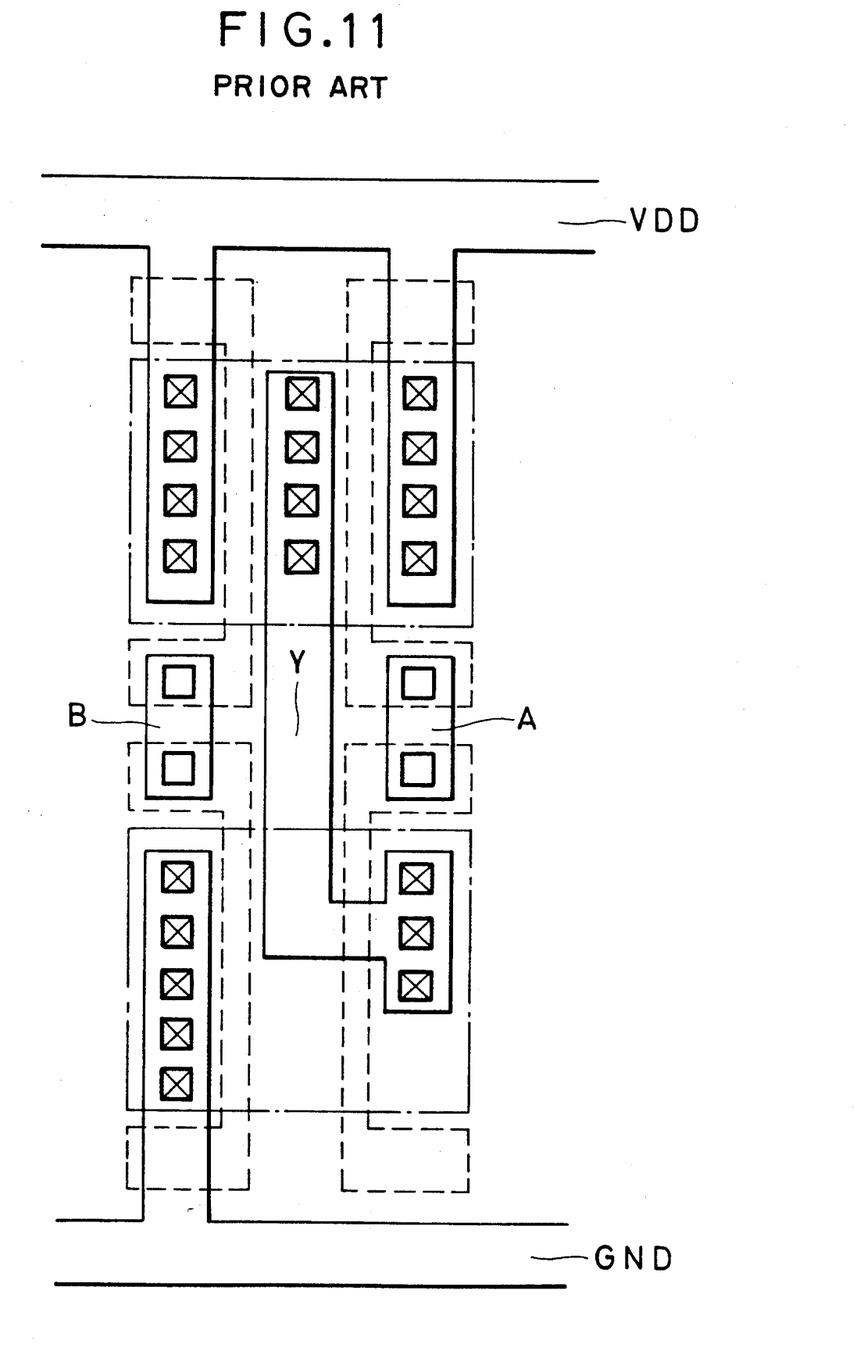
FIG. 11 is an integrated circuit pattern diagram of the conventional NAND logic gate.

FIG. 11 is an integrated circuit pattern diagram showing the semiconductor integrated circuit in which the conventional contacts are used.

Figure 12:
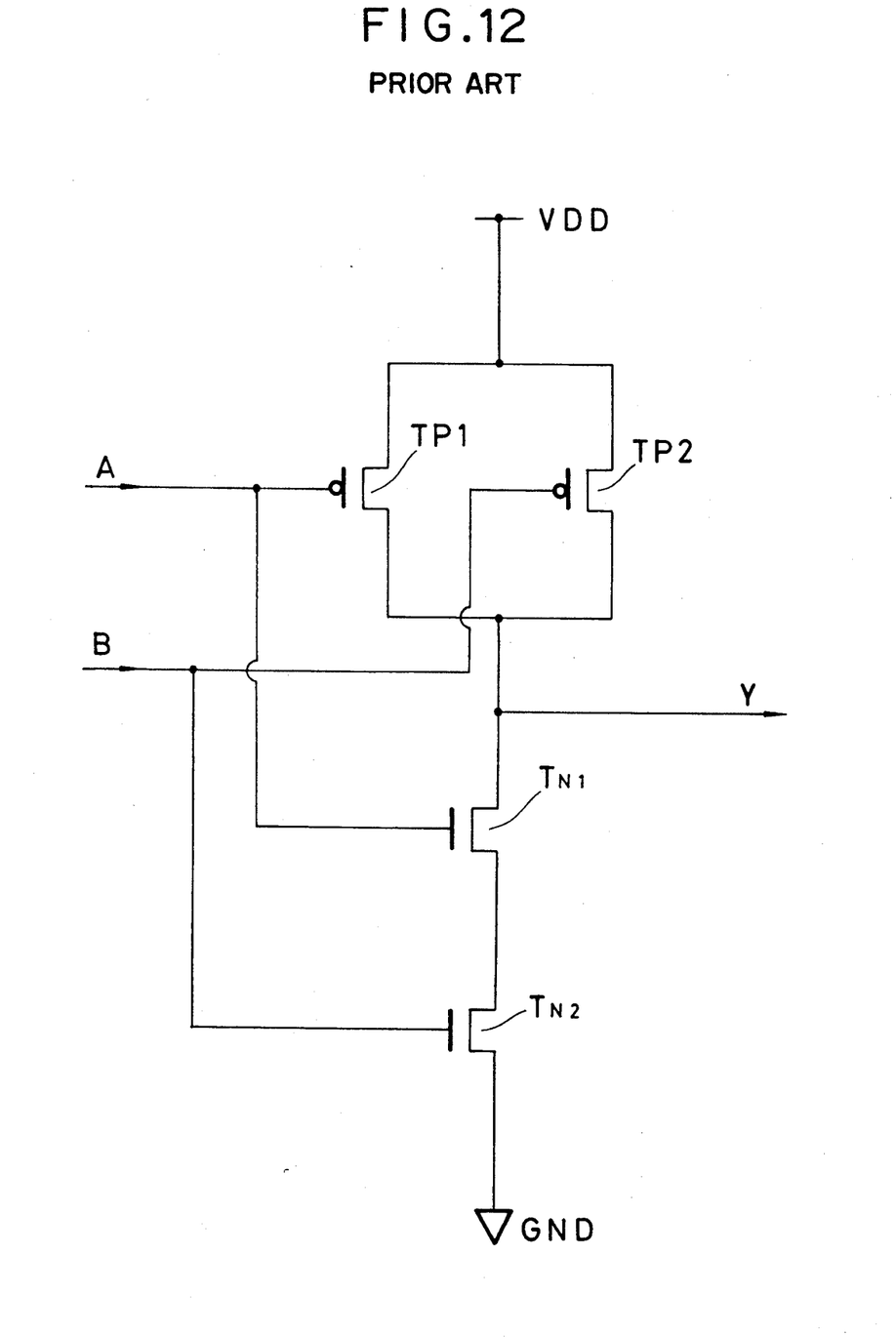
FIG. 12 is a circuit diagram of a NAND logic gate.

In the integrated circuit pattern shown in this FIG. 11, a NAND logic gate shown in the circuit diagram in FIG. 12 is constituted by the contacts disclosed in the aforesaid Japanese Patent Publication No. 33746/1987.

That is, in this FIG. 11, the contacts formed by the plurality of square contacts spaced apart from one another are used for connection between a power line VDD and source of a P channel MOS transistors TP1 and TP2, connection between a drain of the P channel MOS transistor TP1, a drain of the P channel MOS transistor TP2 and a drain of an N channel MOS transistor TN1 and connection between a source of an N channel MOS transistors TN2 and a ground line GND.

Even when the dimensions of the integrated circuit pattern of the logic gate such as the NAND logic gate are reduced to improve the degree of integration of the semiconductor integrated circuit, by applying the technique disclosed in Japanese Patent Publication No. 33746/1987 as described above, the working accuracy of the contacts used in this semiconductor integrated circuit can be improved.

However, when the contacts disclosed in the aforesaid Japanese Patent Publication No. 33746/1987 are used, such a problem is presented that portions between the plurality of contacts in the integrated circuit pattern cannot be used for electrical connection, whereby the area of the contact region where the contacts can be arranged cannot be effectively used. Therefore the electric resistance by the contacts is increased, so that electrical properties are deteriorated.

More specifically, in FIG. 11, when supplied from the power line VDD or the ground line GND, an output current outputted from an output terminal Y flows through predetermined contacts. In this case, when the electric resistance of the respective contacts are increased, the output properties and the like of the logic gate is deteriorated.

SUMMARY OF THE INVENTION

The present invention has been developed to obviate the above-described disadvantages and its object resides in that, in a semiconductor integrated circuit and method of inter-layer connection therefor, using a contact having a relatively longer lengthwise dimension than a widthwise dimension for electrically connecting different layers to each other, which are a plurality of layers of laminated structure such as wiring layers made of polycrystalline silicon and metal, even if the contact is a very small contact, the working accuracy thereof can be improved, the electric resistance by the contact can be decreased and the electric properties thereof can be improved.

To achieve the above-described object, according to the present invention, in the semiconductor integrated circuit using the contact having the relatively longer lengthwise dimension than the widthwise dimension for electrically connecting the different layers to each other, which are the plurality of layers of laminated structure such as the wiring layers made of polycrystalline silicon and metal, a contact is used which includes a configuration in which a first pattern having a widthwise dimension W1 in an outer shape substantially equal to a lengthwise dimension L1 in an outer shape and a second pattern having a widthwise dimension W2 in an outer shape shorter than the lengthwise dimension W1 in an outer shape of the first pattern are connected to each other.

To achieve the above-described object, according to the present invention, in the method of inter-layer connection for the semiconductor integrated circuit using the contact having the relatively longer lengthwise dimension than the widthwise dimension for electrically connecting the different layers to each other, which are the plurality of layers of laminated structure such as the wiring layers made of polycrystalline silicone and metal, a contact is used which includes a configuration in which a first pattern having a widthwise dimension W1 in an outer shape substantially equal to a lengthwise dimension L1 in an outer shape and a second pattern having a widthwise dimension W2 in an outer shape shorter than the lengthwise dimension W1 in an outer shape of the first pattern are connected to each other.

According to the present invention, the degree of integration of the semiconductor integrated circuit is improved and the dimensions of the contact used in the semiconductor integrated circuit are decreased, whereby, even when the turn-in amount of light at the time of exposure is increased during the working on the contact and saggings of the photoresist occur at the time of developing or baking, such a configuration of the contact is found that the above-described problems are lightened and the area of a contact region where the contact can be disposed is effectively utilized.

Figure 1:
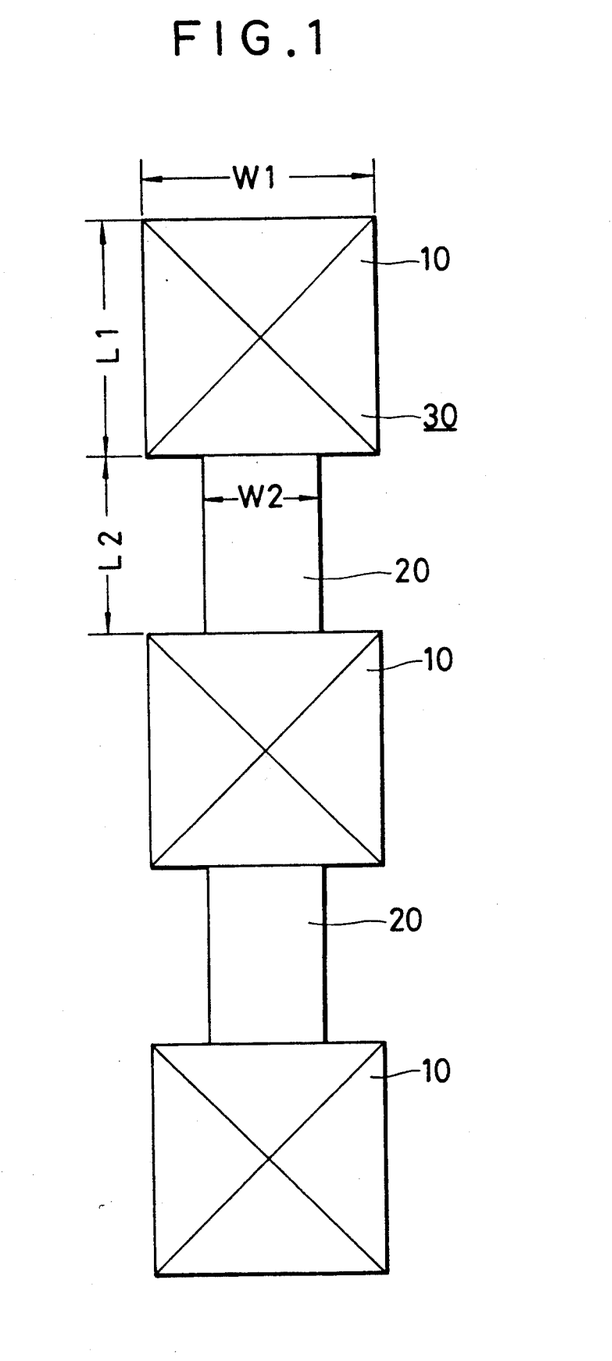
FIG. 1 is a first integrated circuit pattern diagram showing the gist of the present invention.

FIG. 1 is an integrated circuit pattern diagram showing the gist of the present invention.

In this FIG. 1, a contact 30 is constituted by totally three first patterns 10 and totally two second patterns 20. That is, the contact 30 has a configuration in which the first patterns 10 and the second patterns 20 are alternately connected to each other.

In this FIG. 1, a widthwise dimension W1 of the first pattern 10 in an outer shape is substantially equal to a lengthwise dimension L1 of the first pattern 10 in an outer shape.

Furthermore, a widthwise dimension W2 of the second pattern 20 in an outer shape is smaller than a widthwise dimension W1 of this first pattern 10 in an outer shape.

As for a ratio between the dimension W1 and the dimension W2, in consideration of the working techniques (including accuracy) in shaping of the photoresist, etching and the like, the value of the dimension W2 may be determined in accordance with the dimension W1 through the relationship with the following expressions.

when $W1 > 2 \mu m$, $W2 \approx 0.8\ W1$
when $1 \leq W1 \leq 2\ 82\ m$, $W2 \approx 0.7\ W1$
when $W1 < 1 \mu m$, $W2 \approx 0.5\ W1$ The inventor of the present invention has found that, by using the configuration in which the first pattern 10 and the second pattern 20 are connected to each other, the turn-in amount of light at the time of exposure can be decreased and unevenness of saggings of the photoresist depending on the longer side or the shorter side of the contact at the time of developing or baking can be decreased.

Furthermore, the inventor has found that, by use of the configuration of the contact according to the present invention, the area of the contact region where the contact can be disposed is effectively utilized, whereby the electric resistance by the contact is decreased, so that the electric properties of the logic gate and the like can be improved.

Incidentally, according to the present invention, the shapes of the first pattern and the second pattern should not necessarily be limited to the square or rectangular form as shown in FIG. 1 and may be polygons such as a pentagon and a hexagon, or a circle, an ellipse and patterns partially including curves.

That is, it suffices only if the widthwise dimension W1 of the first pattern 10 in the outer shape is substantially equal to the lengthwise dimension L1 of the first pattern 10 in the outer shape and the widthwise dimension W2 of the second pattern 20 in the outer shape is smaller than the widthwise dimension W1 of the first pattern 10 in the outer shape.

Figure 2:
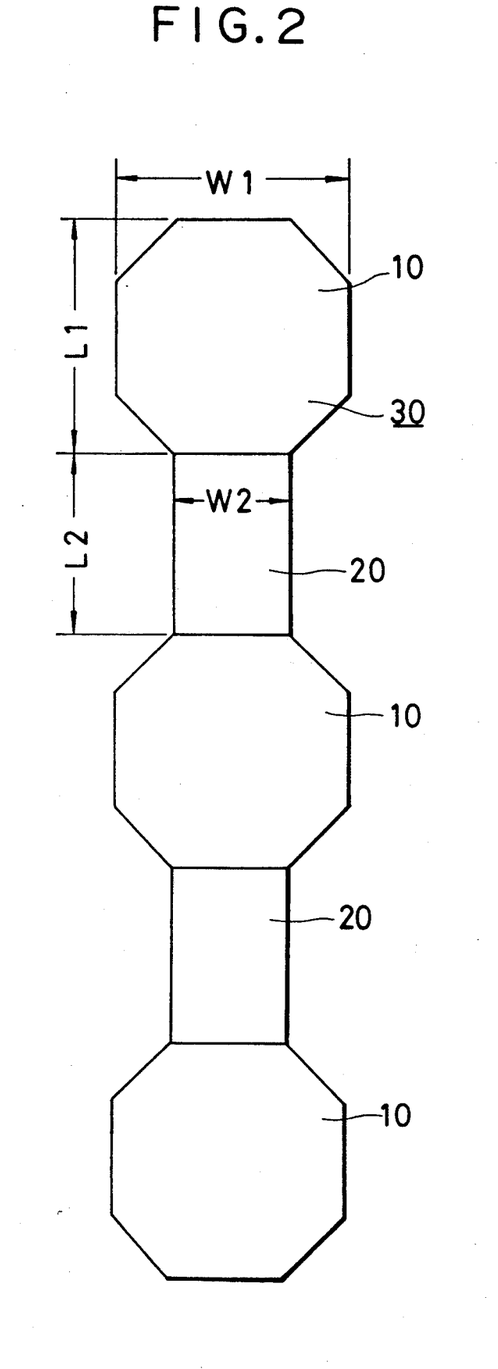
FIG. 2 is a second integrated circuit pattern diagram showing the gist of the present invention.

For example, as shown in FIG. 2, the first pattern 10 may be a polygon such as an octagon.

Figure 3:
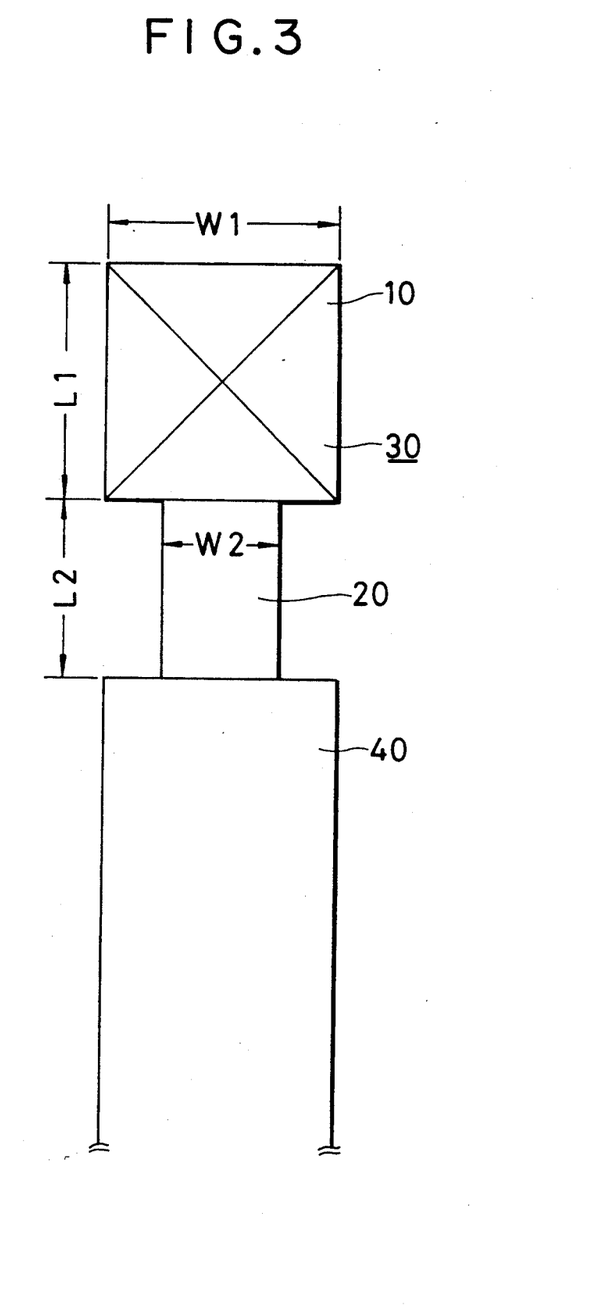
FIG. 3 is a third integrated circuit pattern diagram showing the gist of the present invention.

Furthermore, as shown in FIG. 3, such a configuration of the contact may be adopted that the first pattern 10, the second pattern 20 and another pattern 40 are connected to one another. That is, the configuration of the contact according to the present invention may be used in portions, for which the working accuracy is improved, in one contact.

Figure 4:
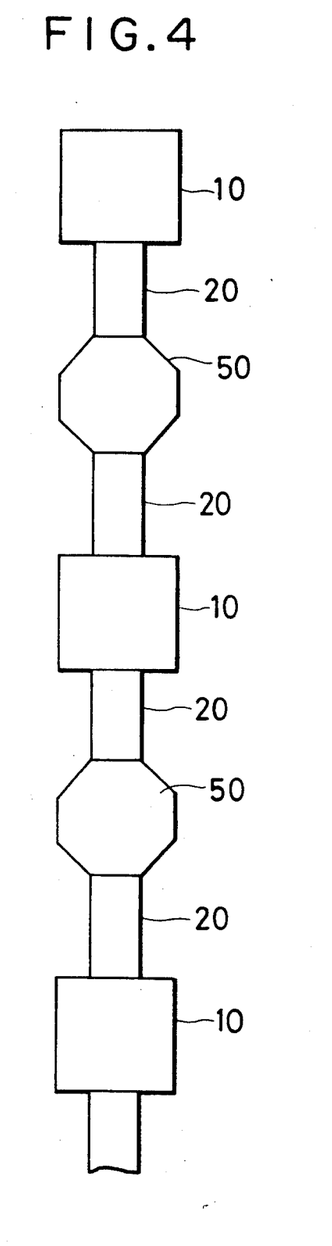
FIG. 4 is a fourth integrated circuit pattern diagram showing the gist of the present invention.

Furthermore, as shown in FIG. 4, such a configuration of the contact including three or more patterns repeatedly connected to one another with regularity can be used. In FIG. 4 the contact has such a configuration that three patterns including the first pattern 10, the second pattern 20 and the third pattern 50 are repeatedly connected to one another with regularity. In FIG. 4, the first pattern 10 or the third pattern 50 having substantially the same dimensions while having different shapes are arranged alternately between the second patterns 20 having the width smaller than the widths of the first pattern 10 and the third pattern 50.

Figure 5:
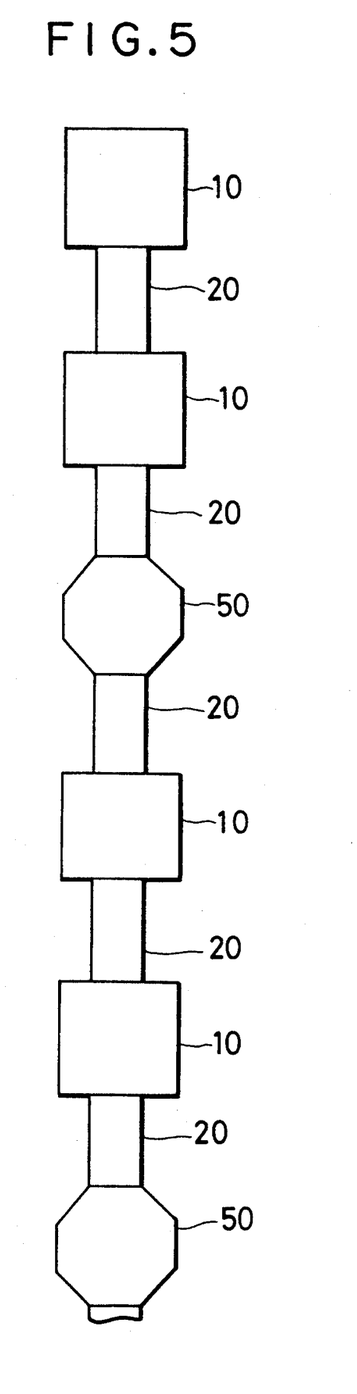
FIG. 5 is a fifth integrated circuit pattern diagram showing the gist of the present invention.

Furthermore, as shown in FIG. 5, three or more patterns can be arranged in the other order. In FIG. 5, three patterns including the first pattern 10, the second pattern 20 and the third pattern 50 is arranged with regularity in the order wherein two of the first pattern 10 and one of the third pattern 50 are arranged alternately between the second patterns 20.

Figure 6:
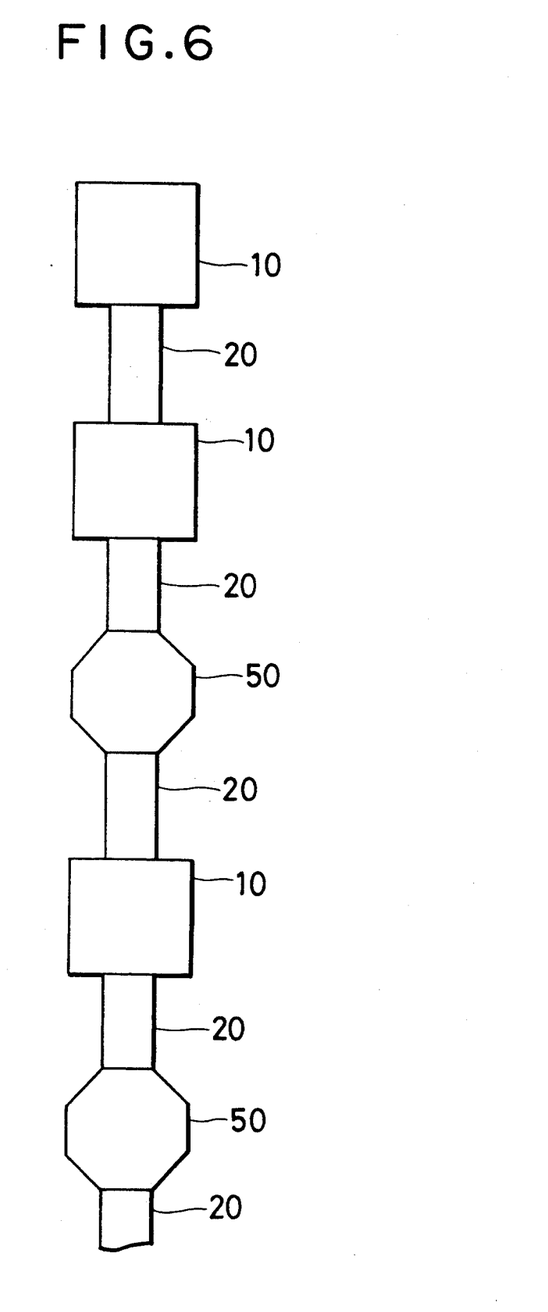
FIG. 6 is a sixth integrated circuit pattern diagram showing the gist of the present invention.

Furthermore, as shown in FIG. 6, the contact may have such a configuration that three or more patterns (the first pattern 10, the second pattern 20 and the third pattern 50 in FIG. 6) can be arranged at random. In FIG. 6, the first pattern 10 or the third pattern 50, and the second pattern 20 are alternately arranged, but the first pattern 10 and the third pattern 50 are arbitrarily arranged.

As has been described hereinabove, according to the present invention, in the semiconductor integrated circuit and method of inter-layer connection therefor, using the contact having the relatively longer lengthwise dimension than the widthwise dimension for electrically connecting the different layers to each other, which are the plurality of the layers of laminated structure such as the wiring layers made of polycrystalline silicon and metal, even if the contact is the very small contact, the working accuracy thereof can be improved, the electric resistance by the contact can be decreased and the electric properties thereof can be improved.

BRIEF DESCRIPTION OF THE DRAWINGS

The preferred embodiments will be described with reference to the drawings, wherein like elements have been denoted throughout the figures with like reference numerals, and wherein.

DESCRIPTION OF THE PREFERRED EMBODIMENTS

The embodiments of the present invention will hereunder be described in detail with reference to the accompanying drawings.

Figure 7:
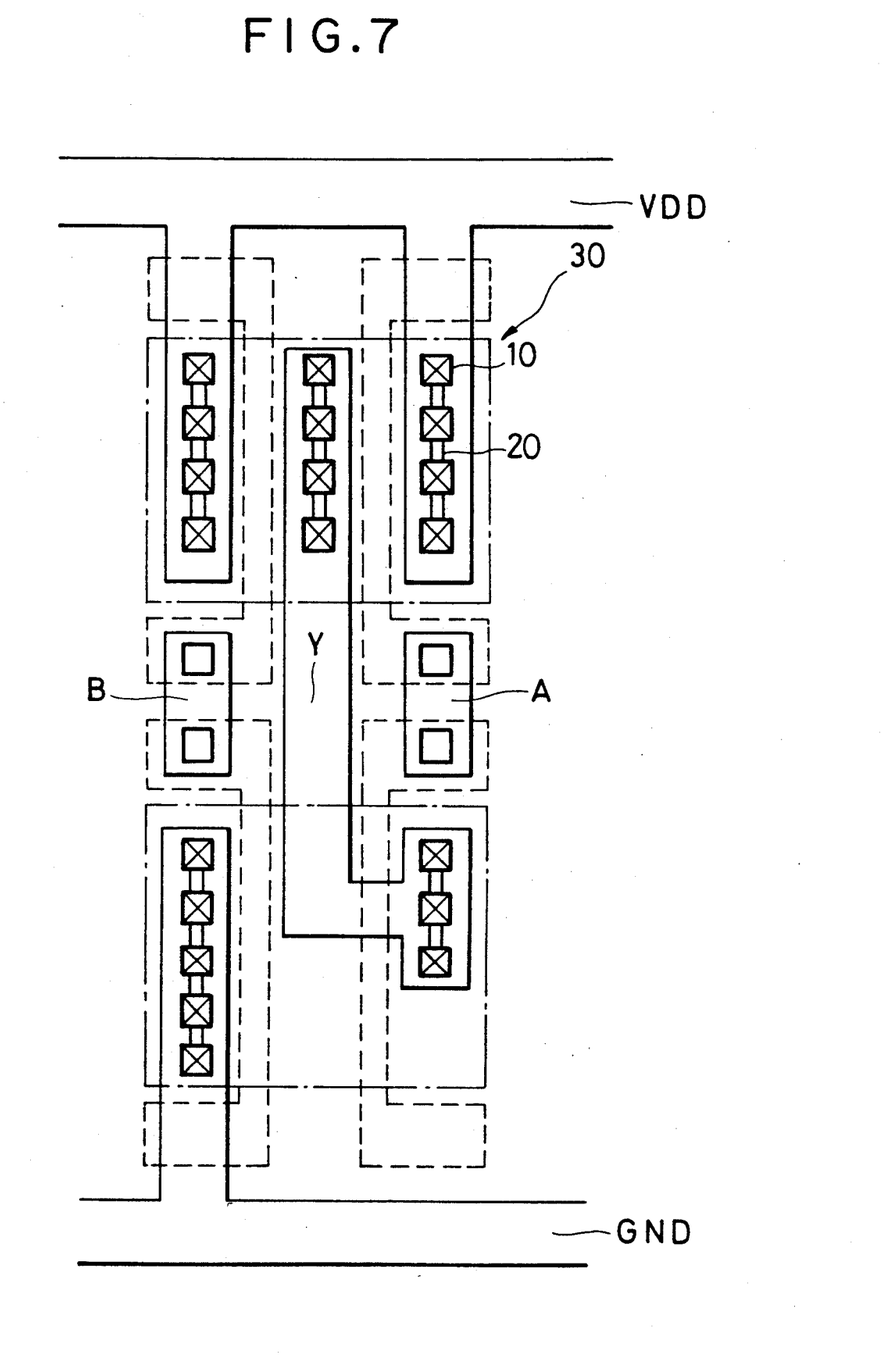
FIG. 7 is an integrated circuit pattern diagram of an first embodiment of the present invention.

FIG. 7 is the integrated circuit pattern diagram of the first embodiment of the present invention.

The circuit in this FIG. 7 represents the same circuit as the integrated circuit pattern diagram of the NAND logic gate in the aforesaid FIG. 12.

In this FIG. 7, the contact of the present invention is applied to the totally five contacts out of the totally nine contacts. That is, the contact of the present invention is applied to the contacts used for the connecting portions between the power line VDD and the source of the P channel MOS transistor TP1, between the power line VDD and the source of the P channel MOS transistor TP2, between the drain of the P channel MOS transistor TP1, the drain of the P channel MOS transistor TP2 and the drain of the N channel MOS transistor TN1 and between the source of the N channel MOS transistor TN2 and the ground line GND.

Figure 10:
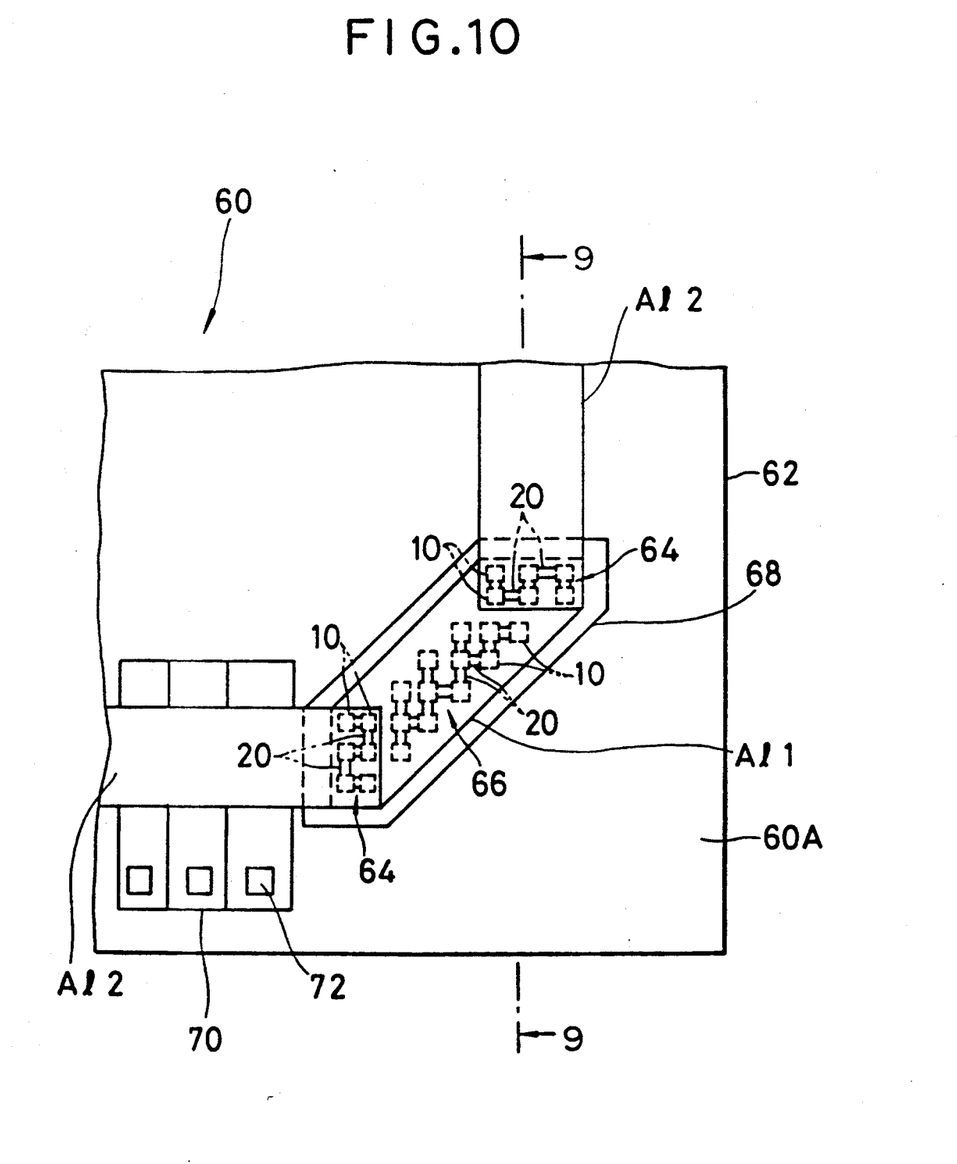
FIG. 10 is an integrated circuit pattern diagram in a modified example of the second embodiment.

In the contact, to which is applied the present invention, the area of the contact is increased by about 40% as compared with the area of the contact corresponding to the conventional contact shown in the aforesaid FIG. 10. Therefore, in the contact, to which is applied the present invention, electric resistance by the contact is decreased as compared with the conventional contact. Accordingly, in the NAND logic gate shown in FIG. 7, such improvements are made in the output properties that the output current suppliable from the output terminal Y can be increased.

Figure 8:
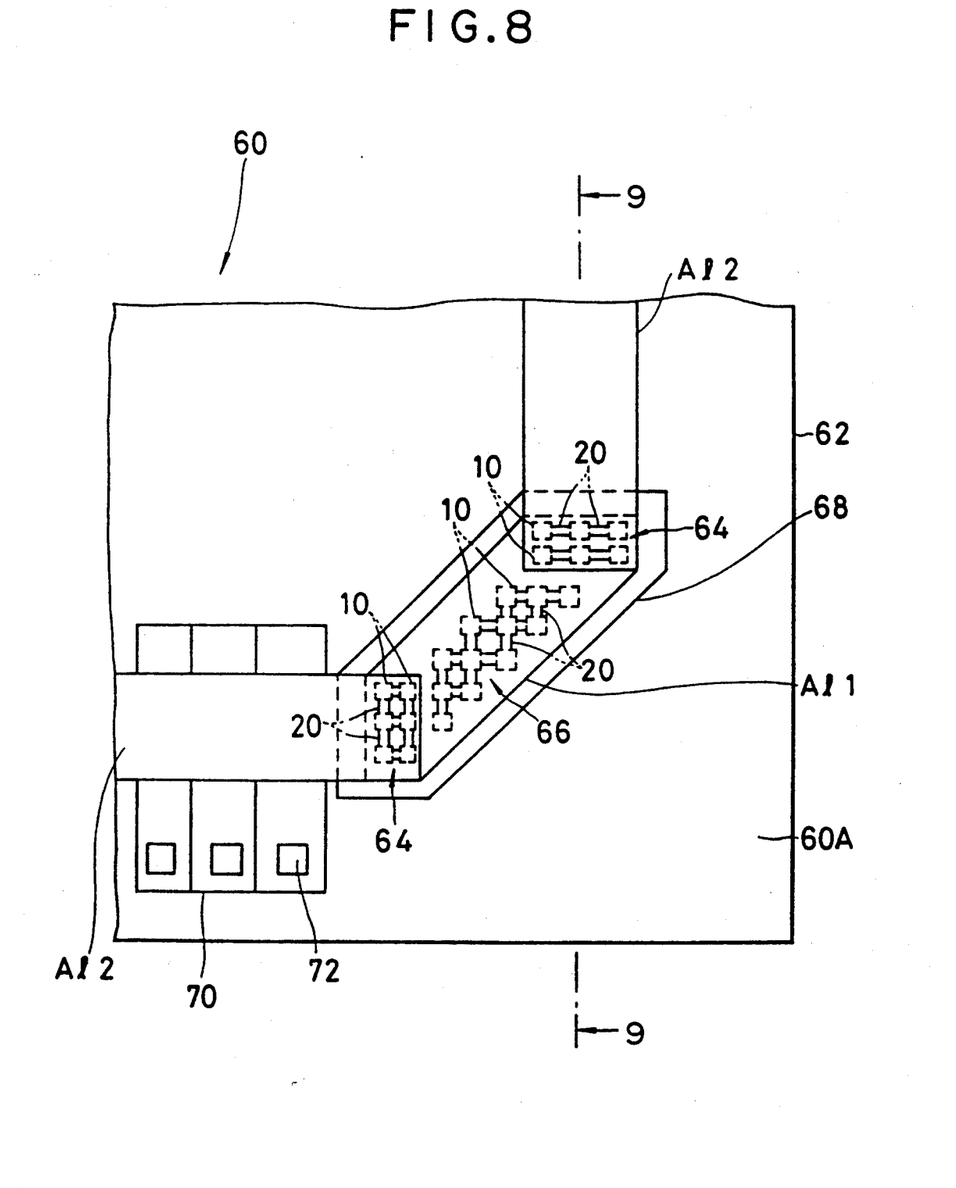
FIG. 8 is an integrated circuit pattern diagram of a second embodiment of the present invention.

Referring to FIG. 8, a second embodiment of the present invention will hereunder be described in which, in order to prevent cracks in an Al layer, e.g. $Al_2$ in a corner portion 60A of a semiconductor chip 60, the present invention is applied to contacts 64 disposed in the corner portion 60A for connecting the $Al_2$ to another Al layer, e.g. $Al_1$ and contacts 66 for fixing the $Al_1$ to a semiconductor substrate 62.

In this embodiment, in either the contacts 64 for connection or the contacts 66 for fixing, the square first patterns 10 are arranged in a two-dimensional matrix pattern and the rectangular second patterns 20 connect the first patterns 10.

In FIG. 8, designated at 68 a diffusion layer, 70 I/O cells and 72 bonding pads.

Figure 9:
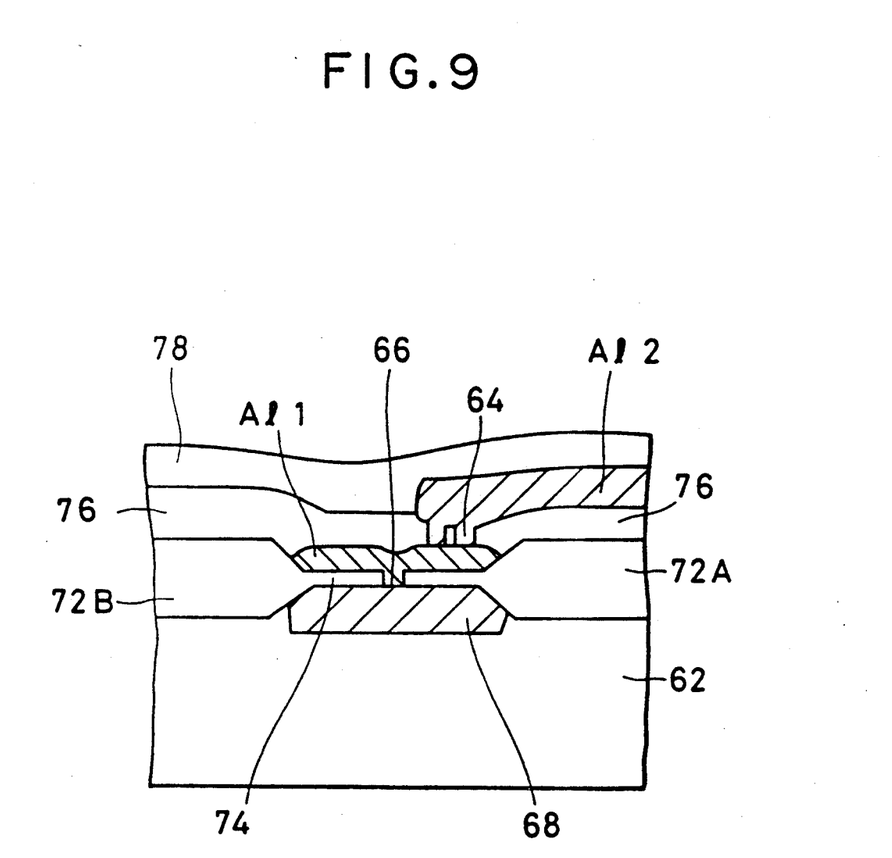
FIG. 9 is a sectional view taken along the line 9—9 in FIG. 8.

FIG. 9 is a sectional view taken along the 9—9 line in FIG. 8.

In FIG. 9, designated at 72A, 72B are LOCOS layers, 74, 76 are inter-layer insulating films and 78 a passivation film.

Incidentally, when the intervals between the first patterns 10 are small and there is a possibility that the photoresist disposed therebetween is peeled off, the first patterns 10 and the second patterns 20 are connected to each other in a zigzag manner as shown in a modified example shown in FIG. 10 for example, so that a region completely separated from the surrounding by the contacts is not produced.

What is claimed is:

1. A semiconductor integrated circuit with a contact having a relatively longer lengthwise contact dimension than a widthwise contact dimension for electrically connecting a first conducting layer to an adjacent second conducting layer through an insulating layer, to form a plurality of layers in a laminated structure including conducting layers and insulating layers deposited therebetween, said conducting layers made of at least one of a semiconductor substrate, polycrystalline silicon and metal, said contact comprising at least one first pattern, each first pattern having a widthwise dimension W1 substantially equal to a lengthwise dimension L1, and at least one second pattern, each second pattern having a widthwise dimension W2 smaller than the widthwise dimension W1 of said each first pattern, said first and second patterns being connected.

2. The semiconductor integrated circuit as set forth in claim 1, wherein the widthwise dimension W1 of said each first pattern and the widthwise dimension W2 of said each second pattern satisfy the relationship of the following expressions, when $W1 > 2$ μm, $W2 \approx 0.8\ W1$
when $1 \leq W1 \leq 2$ μm, $W2 \approx 0.7\ W1$
when $W1 < 1$ μm, $W2 \approx 0.5\ W1$ 3. The semiconductor integrated circuit as set forth in claim 2, wherein said at least one first pattern and said at least one second pattern are alternately arranged.

4. The semiconductor integrated circuit as set forth in claim 3, wherein said each first pattern is a substantially square form.

5. A semiconductor integrated circuit with a contact having a relatively longer lengthwise contact dimension than a widthwise contact dimension for electrically connecting a first conducting layer to an adjacent second conducting layer through an insulation layer, to form a plurality of layers in a laminated structure including conducting layers and insulating layers deposited therebetween, said conducting layers being made of at least one of a semiconductor substrate, polycrystalline silicon and metal, said contact comprising at least one first pattern, each first pattern having a widthwise dimension W1 substantially equal to a lengthwise dimension L1, and at least one second pattern, each second pattern having a widthwise dimension W2 smaller than the widthwise dimension W1 of each said first pattern, said first pattern and said second pattern being alternately arranged, wherein said each first pattern is a substantially octagon form having a side contacting one of said at least one second pattern, said contacting side being at least as large as the widthwise dimension W2 of said one of said at least one second pattern, and said widthwise dimension W1 of said each first pattern and said widthwise dimension of said second each pattern W2 have the following relationship:

when $W1 > 2$ μm, $W2 \approx 0.8\ W1$
when $1\ \mu m < = W1 < = 2\ \mu m$, $W2 \approx 0.7\ W1$
when $W1 < 1$ μm, $W2 \approx 0.5\ W1$.

6. A semiconductor integrated circuit with a contact having a relatively longer lengthwise contact dimension than a widthwise contact dimension for electrically connecting a first conducting layer to an adjacent second conducting layer through an insulation layer, to form a plurality of layers in a laminated structure including conducting layers and insulating layers deposited therebetween, said conducting layers being made of at least one of a semiconductor substrate, polycrystalline silicon and metal, said contact comprising at least one first pattern, each first pattern having a widthwise dimension W1 substantially equal to a lengthwise dimension L1, and at least one second pattern, each second pattern having a widthwise dimension W2 smaller than the widthwise dimension W1 of said each first pattern, said first pattern and said second pattern being alternately arranged, wherein said second pattern is a substantially rectangular form, and said widthwise dimension W1 of said each first pattern and said widthwise dimension of said each second pattern W2 have the following relationship:

when $W1 > 2 \mu m$, $W2 \approx 0.8\ W1$
when $1\ \mu m < = W1 < = 2\ \mu m$, $W2 \approx 0.7\ W1$
when $W1 < 1\ \mu m$, $W2 \approx 0.5\ W1$.

7. A semiconductor integrated circuit with a contact having a relatively longer lengthwise contact dimension than a widthwise contact dimension for electrically connecting a first conducting layer to an adjacent second conducting layer through an insulation layer, to form a plurality of layers in a laminated structure including conducting layers and insulating layers deposited therebetween, said conducting layers being made of at least one of a semiconductor substrate, polycrystalline silicon and metal, said contact comprising at least one first pattern, each first pattern having a widthwise dimension W1 substantially equal to a lengthwise dimension L1, and at least one second pattern each second pattern having a widthwise dimension W2 smaller than the widthwise dimension W1 of said each first pattern, wherein said contact includes at least one third pattern in addition to said at least one first pattern and said at least one second pattern, and said widthwise dimension W1 of said each first pattern and said widthwise dimension of said each second pattern W2 have the following relationship:

when $W1 > 2\ \mu m$, $W2 \approx 0.8\ W1$
when $1\ \mu m < = W1 < 2\ \mu m$, $W2 \approx 0.7\ W1$
when $W1\ 1\ \mu m$, $W2 \approx 0.5\ W1$.

8. The semiconductor integrated circuit as set forth in claim 7, wherein said at least one first pattern, said at least one second pattern and said at least one third pattern are repeatedly and regularly arranged.

9. The semiconductor integrated circuit as set forth in claim 7, wherein said at least one first pattern, said at least one second pattern and said at least one third pattern are randomly arranged.

10. A method of inter-layer connection for a semiconductor integrated circuit using a contact having a relatively longer lengthwise contact dimension than a widthwise contact dimension for electrically connecting a first conducting layer to an adjacent second conducting layer through an insulation layer, to form a plurality of layers in a laminated structure including conducting layers and insulating layers deposited therebetween, said conducting layers made of at least one of a semiconductor substrate, polycrystalline silicon and metal, the method comprising said contact comprising at least one first pattern, each first pattern having a widthwise dimension W1 substantially equal to a lengthwise dimension L1; simultaneously forming at least one second pattern, each second pattern being formed to have a widthwise dimension W2 smaller than the widthwise dimension W1 of said each first pattern; and simultaneously connecting said first and second patterns.

* * * * *